United States Patent
Adler et al.

(10) Patent No.: US 8,949,766 B2
(45) Date of Patent: Feb. 3, 2015

(54) DETECTING CORRESPONDING PATHS IN COMBINATIONALLY EQUIVALENT CIRCUIT DESIGNS

(71) Applicant: International Business Machines Corporation, Armonk, NY (US)

(72) Inventors: Oshri Adler, Haifa (IL); Eli Arbel, Nesher (IL); Ilan Beer, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/875,309

(22) Filed: May 2, 2013

(65) Prior Publication Data

US 2014/0331199 A1    Nov. 6, 2014

(51) Int. Cl.
    *G06F 17/50*    (2006.01)
(52) U.S. Cl.
    CPC ................................ *G06F 17/5081* (2013.01)
    USPC ............ 716/136; 716/100; 716/106; 716/111
(58) Field of Classification Search
    USPC .................................. 716/100, 106, 111, 136
    See application file for complete search history.

(56) References Cited

U.S. PATENT DOCUMENTS

| | | | |
|---|---|---|---|
| 8,191,034 B1 * | 5/2012 | Mohan | 716/136 |
| 8,234,609 B2 | 7/2012 | Kurshan et al. | |
| 8,245,166 B2 | 8/2012 | Baumgartner et al. | |
| 8,713,509 B2 * | 4/2014 | Arbel et al. | 716/132 |

OTHER PUBLICATIONS

Vishnubhotla et al., "A path Analysis Approach to the Diagnosis of Combinational Circuits", 1971, DAC Proceedings of the 8$^{th}$ Design Automation Workshop, pp. 222-230.*

Saldanha et al., "Performance Optimization using Exact Sensitization", 1994, DAC Proceedings of the 31th annual Design Automation Conference, pp. 425-429.*

Kapoor et al., "Area, Performance, and Sensitizable Paths", Mar. 1994, Fourth Great Lakes Symposium on Design Automation of High Performance VLSI Systems, Proceedings, pp. 222-227.*

* cited by examiner

*Primary Examiner* — Sun Lin
(74) *Attorney, Agent, or Firm* — Riv Glazberg

(57) ABSTRACT

A method, apparatus and product for detecting corresponding paths in combinationally equivalent circuit designs. The method comprising: obtaining a first circuit design and a second circuit design, the first and second circuit designs have corresponding sets of input and output elements; obtaining a path in the first circuit design, the path commencing in an input element and ending in an output element, wherein the input element and the output element are connected by combinational logic elements; automatically extracting, by a computer, a sensitization function of the path in the first circuit design; and automatically determining, by the computer, one or more paths in the second circuit design which are sensitized by the sensitization function of the path.

18 Claims, 3 Drawing Sheets

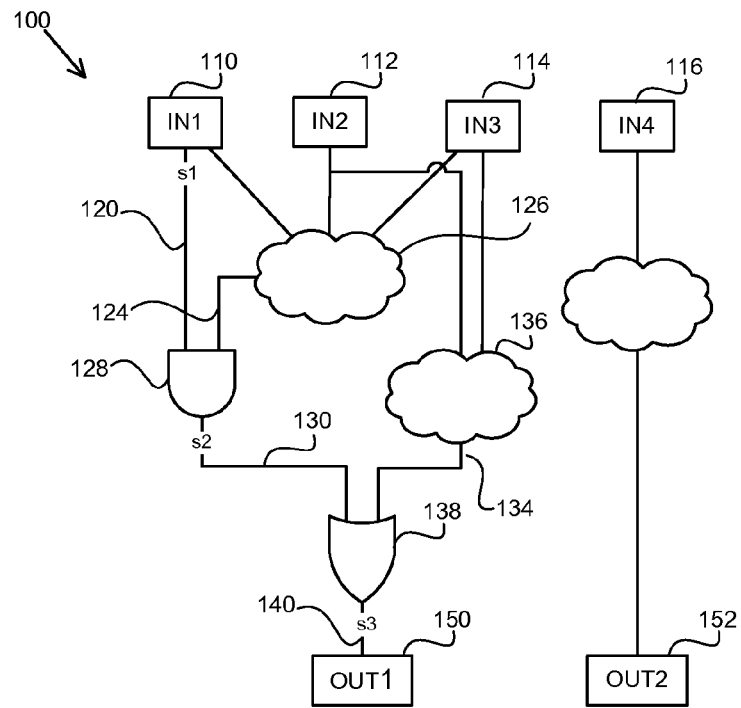
FIG. 1A
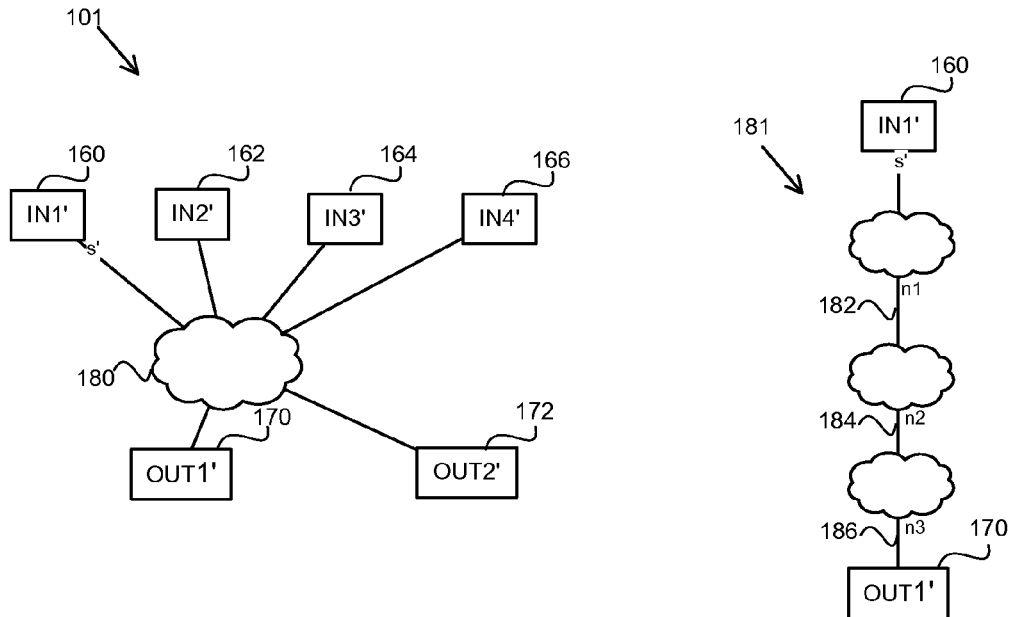
FIG. 1B
FIG. 1C

DETECTING CORRESPONDING PATHS IN COMBINATIONALLY EQUIVALENT CIRCUIT DESIGNS

TECHNICAL FIELD

The present disclosure relates to circuit design in general, and to functionally equivalent circuit designs, in particular.

BACKGROUND

A circuit design may be presented using functionally equivalent, though different, representations. The different representations may be considered as being of different abstraction levels. One example of functionally equivalent representations is pre-synthesis and post-synthesis designs.

The process of synthesizing logic given in Register Transfer Level (RTL) description into a placed-and-routed circuit description involves numerous steps, in which many transformations are often applied to the design netlist. Specifically, these may include logic optimization in which various techniques are used for optimizing the design for desired objective functions, usually reducing delay and area. Logic optimization techniques can range from simple equivalent gate merging, to logic refactoring and rewriting and even more aggressive reduction and optimization methods. A common side effect of those optimization techniques is that signal names and the original logic structure are not necessarily preserved throughout the process, and usually the final design netlist is much different than the initial netlist in this regard. As a result any task which involves using the post-synthesis data to analyze behavior, bugs or any kind of problem in the high-level RTL descriptions is problematic as it is usually hard to establish a correlation between the post-synthesis data and the original RTL representation.

The circuit designs may have corresponding input and output elements. Input elements include primary inputs of the circuit as well as output signals of memory elements, such as latches and flip-flops, based on which the combinational logic of the circuit design is applied to define outputs in each cycle. Output elements include primary outputs of the circuit as well as input signals of the memory elements. Though the circuits may differ in the signals used and in the combinational logic implementations, they may preserve correlations between the primary inputs, primary outputs and memory elements. In addition, the circuits may be functionally equivalent so they require that each output element would provide the same function in both designs.

BRIEF SUMMARY

One exemplary embodiment of the disclosed subject matter is a computer-implemented method comprising: obtaining a first circuit design and a second circuit design, the first and second circuit designs have corresponding sets of input and output elements, wherein for each pair of corresponding output elements, the first and second circuit designs define a pair of equivalent combinatorial functions to define a value of the pair of output elements, wherein the pair of equivalent combinatorial functions are each defined over the respective set of input elements; obtaining a path in the first circuit design, the path commencing in an input element and ending in an output element, wherein the input element and the output element are connected by combinational logic elements; automatically extracting, by a computer, a sensitization function of the path in the first circuit design; and automatically determining, by the computer, one or more paths in the second circuit design which are sensitized by the sensitization function of the path.

Another exemplary embodiment of the disclosed subject matter is an apparatus having a processor, the processor being adapted to perform the steps of: obtaining a first circuit design and a second circuit design, the first and second circuit designs have corresponding sets of input and output elements, wherein for each pair of corresponding output elements, the first and second circuit designs define a pair of equivalent combinatorial functions to define a value of the pair of output elements, wherein the pair of equivalent combinatorial functions are each defined over the respective set of input elements; obtaining a path in the first circuit design, the path commencing in an input element and ending in an output element, wherein the input element and the output element are connected by combinational logic elements; automatically extracting, by a computer, a sensitization function of the path in the first circuit design; and automatically determining, by the computer, one or more paths in the second circuit design which are sensitized by the sensitization function of the path.

Yet another exemplary embodiment of the disclosed subject matter is a computer program product comprising a non-transitory computer readable medium retaining program instructions, which instructions when read by a processor, cause the processor to perform a method comprising: obtaining a first circuit design and a second circuit design, the first and second circuit designs have corresponding sets of input and output elements, wherein for each pair of corresponding output elements, the first and second circuit designs define a pair of equivalent combinatorial functions to define a value of the pair of output elements, wherein the pair of equivalent combinatorial functions are each defined over the respective set of input elements; obtaining a path in the first circuit design, the path commencing in an input element and ending in an output element, wherein the input element and the output element are connected by combinational logic elements; automatically extracting, by a computer, a sensitization function of the path in the first circuit design; and automatically determining, by the computer, one or more paths in the second circuit design which are sensitized by the sensitization function of the path.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 1A-1C show illustrations of a first and a second circuit designs, in accordance with some exemplary embodiments of the disclosed subject matter;

DETAILED DESCRIPTION

Figure 2:
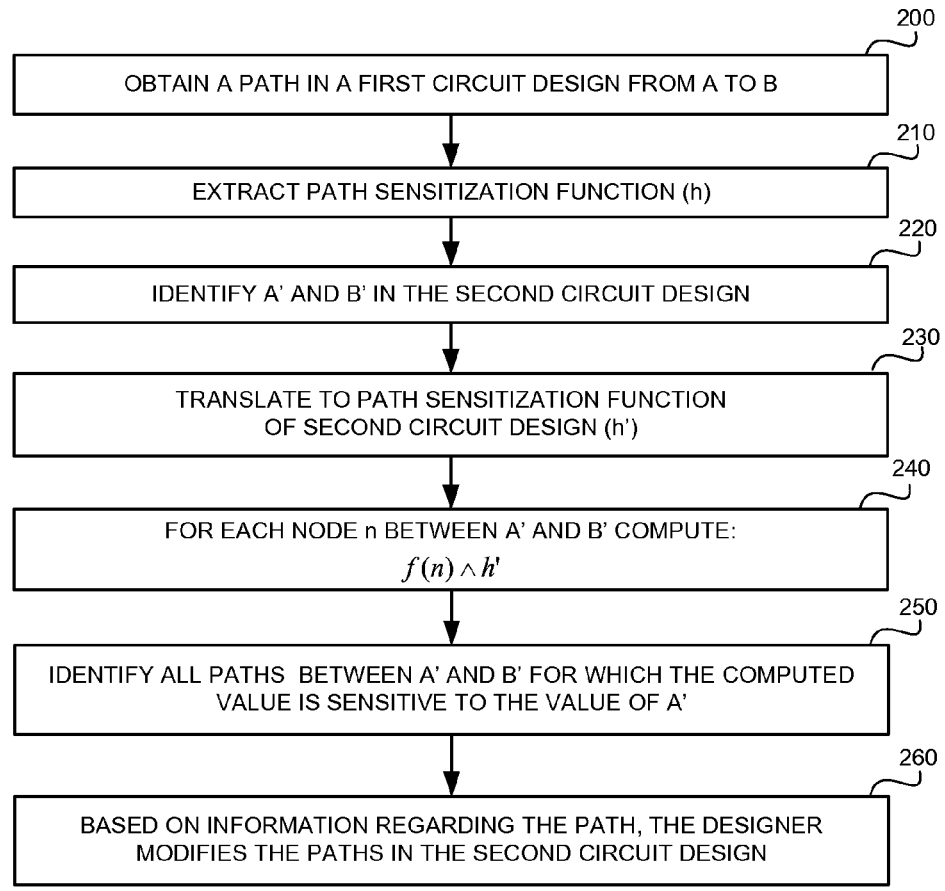
FIG. 2 shows a flowchart diagram of steps in a method, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that blocks of the flowchart illustrations and/or block diagrams, and combinations of blocks in the flowchart illustrations and/or block diagrams, can be implemented by computer program instructions. These computer program instructions may be provided to one or more processors of a general purpose computer, special purpose computer, a tested processor, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable medium that can direct a computer or other programmable data processing apparatus to function in a particular manner, such that the instructions stored in the non-transient computer-readable medium produce an article of manufacture including instruction means which implement the function/act specified in the flowchart and/or block diagram block or blocks.

The computer program instructions may also be loaded onto a device. A computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with the disclosed subject matter is to identify corresponding paths in a first and second equivalent circuit designs. Another technical problem is to identify for a path of a first circuit design, one or more corresponding paths in the second circuit design. In some cases, the path may include signals that do not have a corresponding signal in the second circuit design. Additionally or alternatively, the corresponding paths may include signals that do not have corresponding signals in the first circuit design. Yet another technical problem is to automatically perform path correspondence between a post-synthesis level circuit design with a pre-synthesis level circuit design.

Yet another technical problem is to provide a user, such as a designer, with an automatic tool allowing the user to modify the second design based on an identification of a path in the first design. In particular, allowing the user to modify pre-synthesis design based on the post-synthesis design. As an example, one task which involves using post-synthesis data for analyzing the RTL is that of timing debug. In timing debug designers get list of logic paths which violate timing constraints. Those timing paths may be expressed in terms of the post-synthesis netlist and for users to understand the root of the problem they need to find the corresponding paths in the Register-Transfer Level (RTL) description (e.g., VHDL, Verilog, or the like) which are likely to cause the timing violation. Performing this path correspondence task manually is very time consuming as the critical paths are expressed in terms of signals names often not appearing in the RTL and moreover, may contain low-level technology-mapped gates which do not appear in the RTL at all.

One technical solution provided by the disclosed subject matter is to extract a sensitization function of the path in a first circuit, which is between a first input element and a first output element, and detect in a second circuit paths that are sensitized by the sensitization function, which are between a second input element and a second output element that correspond to the first input and output elements, respectively.

The sensitization function may be indicative of the combinations of input values for which information propagates through the path, starting from the input element of the path and ending in the output element of the path. In some exemplary embodiments, the sensitization function is a function over the input elements of the circuit that is true when the value of the input element of the path is observable in the output element of the path and through each intermediate element there between which is included in the path. Additionally or alternatively, a sensitization function is true for an input vector such that all off-path signals of path gates are set to non-controlling values.

In some exemplary embodiments, the sensitization function may be determined by statically analyzing the path, such as by requiring that non-controlling values be assigned to every off-path input signal that is provided through the path. Additionally or alternatively, Boolean Difference may be computed to determine the inputs for which the input element of the path is observable.

The sensitization function, which is defined over the input elements of the first circuit design, may be translated to a corresponding sensitization function that is defined over the input elements of the second circuit design.

In some exemplary embodiments, the second design may be analyzed to determine paths between the second input and output elements for which the corresponding sensitization function is held through-out the path.

In some exemplary embodiments, Binary Decision Diagrams (BDDs) may be used to represent the sensitization functions and to provide for efficient computation. Additionally or alternatively, a Conjunctive Normal Form (CNF) formula may be defined to allow for the use of a Boolean Satisfiability (SAT) solver, which may provide for efficient computation.

In some exemplary embodiments, path sensitization function can be strengthened with additional constraints, such as constraints provided by the designer, thereby blocking other paths in the cone from being sensitized.

One technical effect of utilizing the disclosed subject matter is to automatically identify corresponding paths in corresponding designs, without having to rely on pattern matching or assumptions regarding signal preservations within the combinational logic. The disclosed subject matter may rely solely on functional properties of the design which may be preserved when changing abstraction level. As an example, the functional properties are preserved during synthesis.

The disclosed subject matter may be used to detect corresponding paths even in cases where some signals are present in one path that have no corresponding signals in the other path. As an example, signals from the high-level circuit design may be removed in some cases. Additionally or alternatively, signals may be introduced to the low-level circuit design to provide functionality that is absent from the high-level circuit design, and which does not affect the resulting values in the output elements.

Another technical effect is providing a method that is robust enough to overcome significant amount of change in the signals between the different representations, including, but not limited to, changes in the names of the signals, removal of signals and introduction of new signals.

Yet another technical effect is to determine corresponding paths in functionally equivalent circuit designs having a different level of abstraction, such as for example post and pre-synthesis designs. It will be noted that the paths are logical paths that represent propagation of data through combinational logic during a single cycle of the design.

Referring now to FIG. 1A showing an illustration of a first circuit design, in accordance with some exemplary embodiments of the disclosed subject matter. Circuit 100 is a circuit design. Circuit 100 may be, for example, a post-synthesis circuit design.

Circuit 100 is exemplified as having four input elements (110, 112, 114, 116), which may be, for example, primary inputs of the design, output signals of memory elements of the design which provide a value based on a computation in a previous cycle, or the like. Circuit 100 has two output elements (150, 152), such as, for example, primary outputs of the design or input signals of memory elements used by the design. In some exemplary embodiments, the memory element may be, for example, a latch, a flip-flop, or the like.

A path of Circuit 100 may be obtained, such as based on analysis of Circuit 100. As an example, the path may be obtained based on a determination that there is a timing problem in the path, based on the fact the it was manually modified and its modification should also be reflected in a corresponding circuit (e.g., Circuit 101 of FIG. 1B), based on a desire to perform backward annotation of the path, or the like. The path may connect between IN1 110 and OUT1 150 through Signal s1 120, Signal s2 130 and Signal s3 140. The value of IN1 110 propagates through the path and affects the value of OUT1 150.

It will be noted that the value of IN1 110 may propagate to OUT1 150 through different paths, such as through combinatorial logic 126.

A sensitization function of the path may be extracted based on combinatorial logic of the path. The sensitization function may require that each off-path signal be assigned with a non-controlling value throughout the path. As an example, AND Gate 128 is part of the combinational logic of the path. Signal 124 is assigned a non-controlling value by assigning to it the value "1" thereby requiring that the value of Signal s2 130 be sensitive to the value of Signal s1 120. Requiring that the Signal 124 be assigned the value "1" may be seen as a constraint over the combinational logic 126 defining its value. The constraint may be defined over input elements. In this case, it may be defined over IN1 110, IN2 112 and IN3 114.

Similarly, and with respect to OR Gate 138, it may be required that Signal 134 be assigned with the value "0" to require that the value of Signal s3 140 be sensitive to the value of Signal s2 130. Such a constraint may be defined based on combinational logic 136 and over input elements IN2 112, IN3 114.

The constraints over each signal along the path may be conjuncted to provide the sensitization function.

In some exemplary embodiments, combinational logics may be represented efficiently using BDDs and thereby allow for efficient computation of the sensitization function. Additionally or alternatively, the constraints may be expressed using CNF formulas to allow the use of a SAT solver when the function is applied.

Additionally or alternatively, a Boolean Difference may be computed for each signal along the path and conjuncted. The Boolean difference for a signal s with respect to Signal s1 120 of IN1 110 may be defined as $\frac{\partial s}{\partial s1} = s(\ )|_{v=0} \oplus s(\ )|_{v=1}$.

In some exemplary embodiments, BDDs may be used to compute Boolean differences for each signal along the path with respect to the starting signal of the path and conjunct them with one another.

Referring now to FIG. 1B showing a second circuit design, in accordance with some exemplary embodiments. Circuit 101 may be functionally equivalent to Circuit 100. In some exemplary embodiments, there may be a one-to-one correspondence between input elements (IN1' 160, IN2' 162, IN3' 164, IN4' 166 with IN1 110, IN2 112, IN3 114, IN4 116) and between output elements (OUT1' 170, OUT2' 172 with OUT1 150, OUT2 152). It will be noted that in the specification and in the claims, for clarity purposes, the two circuits are said to have the same set of input and output elements even though they may have different sets of input and output elements that only correspond, in a one-to-one manner, to one another.

In some exemplary embodiments, Circuit 100 and Circuit 101 may be combinationally equivalent. Combinationally equivalent circuits may provide the same output values in all output elements for the same input values in the input elements. In other words, for each output element, a Boolean function defining its value would be the same in both circuits.

The combinational logic and signals within the combinational logic may differ. In some exemplary embodiments, there may be signals in Circuit 100 that have no corresponding signals in Circuit 101 and vise versa. In some exemplary embodiments, a single signal in one circuit may be represented by a plurality of signals in the other circuit. Furthermore, a single signal in one circuit may correspond to several different signals in the other circuit.

In the present example, we are interested in detecting all paths in Circuit 101 that correspond to the path s1, s2, s3 of Circuit 100. All such paths must begin at IN1' 160 (s') and end at OUT1' 170. Based on the details of combinational logic 180, there may be several such paths which may be sensitive to additional input values. As an example, it will be noted that the value of IN4' 166 may allegedly affect the value of OUT1' 170 in Circuit 101. However, as the value of IN4 116 does not affect the value of OUT1 150 in Circuit 100 and as both circuits are combinationally equivalent, each path between IN4' 166 to OUT1' 170 must be a false path that can never propagate the value of IN4' 166 fully to the end point of the path.

In some exemplary embodiments, the sensitization function, denoted as h, defined over the IN1 110, IN2 112 and IN3 114 may be translated to the terminology of Circuit 101 by being defined over IN1' 160, IN2' 162 and IN3' 164. The translated function, also referred to as corresponding sensitization function and denoted as h', may be used to determine for each signal within combinational logic 180 whether the value of s' is observable at the signal in the same cases in which the path is taken in Circuit 100.

Referring now to FIG. 1C showing a path in Circuit 101, in accordance with some embodiments of the disclosed subject matter. A Path 181 of Circuit 101 (passing through signals s', n1, n2, n3) corresponds to the path s1, s2, s3 of Circuit 100 if for each signal of path 181 the corresponding sensitization function is true and its value is sensitive to the value of s'. In some exemplary embodiments, for each signal s of Path 181 we compute $f(s) \wedge h'$, where $f(s)$ is the Boolean function representing the signal s as defined by Circuit 101 based on combinational logic, such as AND, OR, XOR and similar elements. If the computed function has in its support the signal s' then the value of s' affects its value and it is considered sensitive to s'.

It will be noted that different embodiments may implement the disclosed subject matter in a different manner. As an example, in one embodiment, each signal of every potential paths between IN1' 160 and OUT1' 170 may be analyzed in accordance with the disclosed subject matter. In another embodiment, only signals in the fan-in cone of influence of OUT1' 170 and/or fan-out cone of influence of IN 160 may be analyzed. Based on the analysis of the signals, it may be determined which signals are sensitive to s' for input values that cause the target path of Circuit 100 to be taken. Based on such signals, one or more corresponding paths in Circuit 101 may be constructed.

Referring now to FIG. 2 showing a flowchart diagram of steps in a method, in accordance with some exemplary embodiments of the disclosed subject matter.

In Step 200, a path in a first circuit design may be obtained. The path may connect two endpoints A and B which are input and output elements respectively. The path may include combinational logic defined by the first circuit design. In some exemplary embodiments, the path may be obtained based on a process of analyzing the first circuit design, such as by detecting a timing problem in the path in a post-synthesis design.

In Step 210, a path sensitization function, denoted as h, may be extracted from the circuit design. The function may be extracted in a CNF form. Additionally or alternatively, the function may be extracted by conjuncting BDDs. In some exemplary embodiments, the function may be extracted by computing Boolean Differences for each signal in the path with respect to the input element.

The first circuit design (e.g., 100) may be combinationally equivalent to a second circuit design (e.g., 101). In Step 220, A' and B' that correspond to A and B respectively may be identified based on a pre-defined correlation between the input and output elements of the two circuit designs. The correlation may be a pre-determined mapping between input and output elements of the two circuits, a translation function for determining a corresponding element in one circuit based on a name of an element in another circuit, or the like.

In Step 230, the path sensitization function may be translated, using the correlation between elements of the two designs, into a corresponding sensitization function, denoted as h'. In some exemplary embodiments, the corresponding sensitization function may be determined based on a projection between the input elements of the first circuit design to the input elements of the second circuit design.

In Step 240, for each node n that can be located in a path between A' and B' (e.g., in the fan-out cone of A' and in the fan-in cone of B'), $f(n) \land h'$ may be computed, where $f(n)$ is the Boolean function defining the value of the signal of the node n. It will be noted that node n may be a gate having an output signal, such as 128 of FIG. 1A. Based on the computation, it may be determined whether or not the value of s' is observable in n under the limitations of the correspondence function. In some exemplary embodiments, this may be determined based on the support of the computed function: in case the support includes the signal s', then the function is sensitive to its value. Additionally or alternatively, it may be determined, such as using a SAT solver, whether there exists a situation in which modifying the value of s' modifies the value of the computed function.

In Step 250, all paths between A' and B' that include only nodes whose signals are sensitive to the value of s' (the signal corresponding to input element A') are identified. Each such path is said to be corresponding to the path of the first circuit design. By identifying all such paths, the disclosed subject matter may be able to identify all paths in the second circuit design that may correspond to the first circuit design.

In Step 260, the designer (or other user) may use information obtained regarding the path of the first circuit design to modify the identified paths of the second circuit design. In some exemplary embodiments, the designer may utilize the identified paths in timing debug, in back annotation and in Engineering Change Order (ECO).

Figure 3:
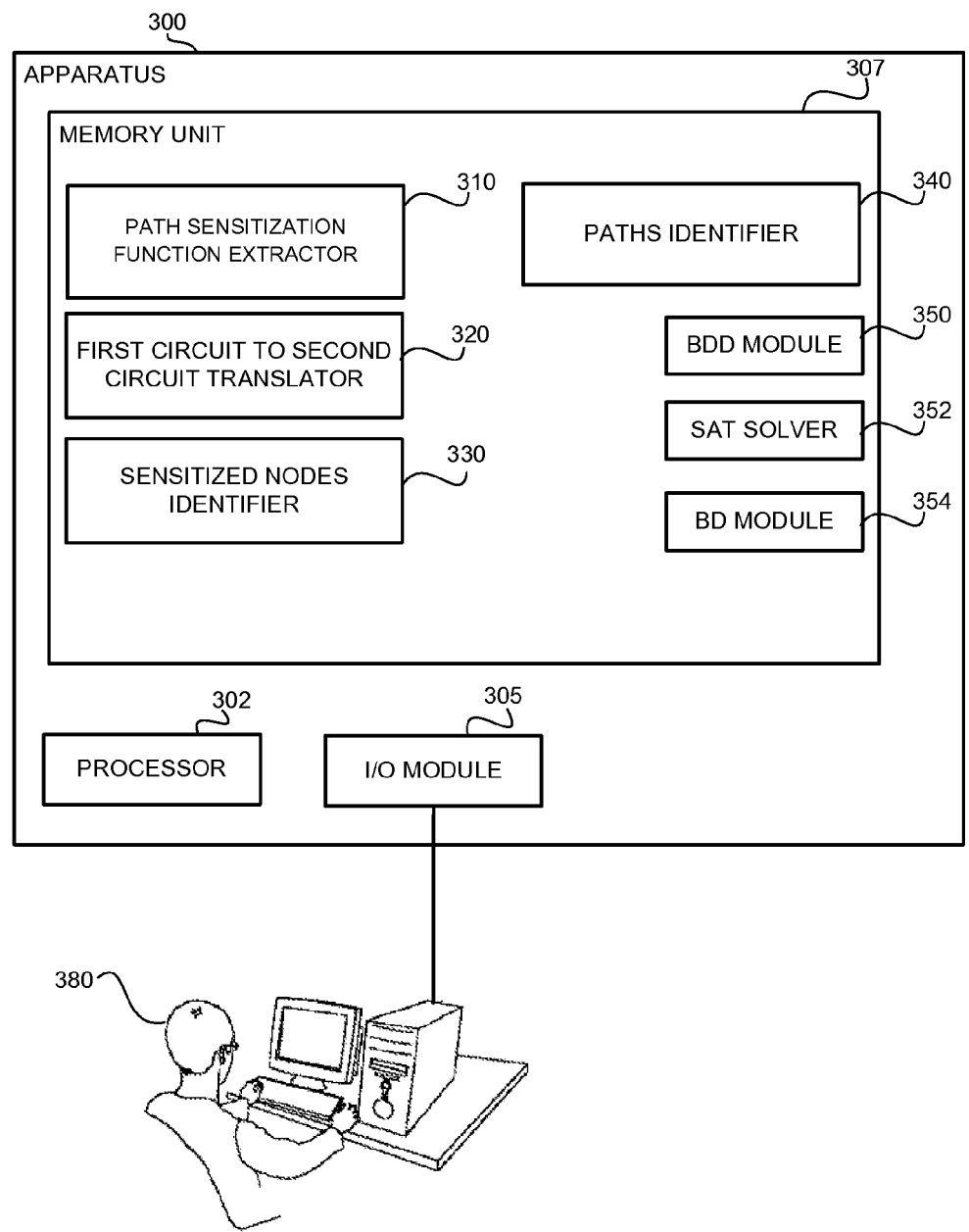
FIG. 3 shows a block diagram of components of an apparatus, in accordance with some exemplary embodiments of the disclosed subject matter.

Referring now to FIG. 3 showing a block diagram of components of an apparatus, in accordance with some exemplary embodiments of the disclosed subject matter. An apparatus 300 may be a computerized apparatus adapted to perform methods such as depicted in FIG. 2.

In some exemplary embodiments, Apparatus 300 may comprise a Processor 302. Processor 302 may be a Central Processing Unit (CPU), a microprocessor, an electronic circuit, an Integrated Circuit (IC) or the like. Alternatively, Apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). The processor 302 may be utilized to perform computations required by Apparatus 200 or any of it subcomponents.

In some exemplary embodiments of the disclosed subject matter, Apparatus 300 may comprise an Input/Output (I/O) Module 305 such as a terminal, a display, a keyboard, an input device or the like to interact with the system, to invoke the system and to receive results. It will however be appreciated that the system can operate without human operation.

In some exemplary embodiments, the I/O Module 205 may be utilized to provide an interface to a User 380, such as a designer, to interact with Apparatus 300, such as by providing the circuit designs, by providing the path in the first circuit design, by modifying the identified paths, or interacting in any similar manner.

In some exemplary embodiments, Apparatus 300 may comprise a Memory Unit 307. Memory Unit 307 may be persistent or volatile. For example, Memory Unit 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, Memory Unit 307 may retain program code operative to cause Processor 302 to perform acts associated with any of the steps shown in FIG. 2 above.

The components detailed below may be implemented as one or more sets of interrelated computer instructions, executed for example by Processor 302 or by another processor. The components may be arranged as one or more executable files, dynamic libraries, static libraries, methods, functions, services, or the like, programmed in any programming language and under any computing environment.

A Path Sensitization Function Extractor 310 may be configured to extract a path sensitization function of a path. Path Sensitization Function Extractor 310 may be used to perform Step 210.

A First Circuit to Second Circuit Translator 320 may be configured to translate, based on a predetermined one-to-one correspondence, an input/output element of the first circuit to a corresponding element of the second circuit. Translator 320 may translate a function, such as the path sensitization function by replacing each element with its corresponding element. In some exemplary embodiments, Translator 320 may utilize pattern matching to translate between the elements. Translator 320 may be used to perform Steps 220 and 230.

Sensitized Nodes Identifier 330 may be configured to compute for nodes of the second circuit design whether they are sensitized to the value of s' under inputs for which the path is taken in the first circuit design. Nodes Identifier 330 may be configured to compute $f(n) \wedge h'$ and determine whether s' is observable for this function. In some exemplary embodiments, Nodes Identifier 330 may compute a BDD for $f(n) \wedge h'$ and may determine whether or not s' is in the support of the resulting BDD. In some exemplary embodiments, Nodes Identifier 330 may identify the nodes out of all the nodes of the second circuit design, out of all the nodes in the fan-in of B', out of all the nodes in the fan-out of A' or the like. In some exemplary embodiments, Nodes Identifier 330 may be used to perform Step 240.

Paths Identifier 340 may be configured to identify paths in the second design that correspond to the path of the first design. The paths may include only nodes identified by Nodes Identifier 330 and may begin in A' and end in B'. Paths Identifier 340 may be used to perform Step 250.

In some exemplary embodiments, a BDD Module 350 may be configured to provide support for BDD manipulation for the components of Apparatus 300. Additionally or alternatively, SAT Solver 352 may be used to solve a CNF formula. In some exemplary embodiments, BD Module 354 may be configured to provide for Boolean Difference functionality. It will be understood that some embodiments may use all of these modules, while other may use only a portion thereof. Additionally or alternatively, some embodiments may use different data structures or computational modules to implement the disclosed subject matter.

The flowchart and block diagrams in the figures illustrate the architecture, functionality, and operation of possible implementations of systems, methods and computer program products according to various embodiments of the present disclosure. In this regard, each block in the flowchart and some of the blocks in the block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, any non-transitory computer-readable medium, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method comprising:
   obtaining a first circuit design and a second circuit design, wherein the first and second circuit designs are separate circuit designs, wherein the first and second circuit designs have corresponding sets of input and output elements, wherein for each pair of corresponding output elements, the first and second circuit designs define a pair of equivalent combinatorial functions to define a value of the pair of corresponding output elements, wherein the pair of equivalent combinatorial functions are each defined over a respective set of input elements;
   obtaining a path in the first circuit design, the path commencing in an input element and ending in an output element, wherein the input element and the output element are connected by combinational logic elements;
   automatically extracting, by a computer, a sensitization function of the path in the first circuit design; and
   automatically determining, by the computer, one or more paths in the second circuit design which are sensitized by the sensitization function of the path in the first circuit design.

2. The computer-implemented method of claim 1, wherein the first and second circuit designs are combinationally equivalent representations of a same circuit, each having a different abstraction level.

3. The computer-implemented method of claim 1, wherein the first circuit design is a post-synthesis version of a circuit and the second circuit design is a pre-synthesis version of the circuit.

4. The computer-implemented method of claim 3, wherein the path in the first circuit design is associated with a timing problem, and the method further comprising a user modifying the one or more paths in the second circuit design to fix the timing problem.

5. The computer-implemented method of claim 3 further comprising using the one or more paths in the second circuit design for an activity selected from a group consisting of: back annotation and Engineering Change Order (ECO).

6. The computer-implemented method of claim 1, wherein said automatically determining comprises determining all paths in the second circuit design that correspond to the path in the first circuit design.

7. The computer-implemented method of claim 1, wherein there exists at least one signal in one of the paths selected from the path in the first circuit design and the one or more paths in the second circuit design that has no corresponding signal in its counterpart circuit design.

8. The computer-implemented method of claim 1, wherein the input and output elements comprise primary inputs, primary outputs and memory elements.

9. The computer-implemented method of claim 1, wherein said automatically determining comprises:
   translating the sensitization function of the path in the first circuit design to a translated sensitization function, wherein the sensitization function is defined over the input elements of the first circuit design, wherein the translated sensitization function is defined over input elements of the second circuit design; and
   determining the one or more paths in the second circuit based on the translated sensitization function.

10. An apparatus having a processor, the processor being adapted to perform the following steps:
    obtaining a first circuit design and a second circuit design, wherein the first and second circuit designs are separate circuit designs, wherein the first and second circuit designs have corresponding sets of input and output elements, wherein for each pair of corresponding output elements, the first and second circuit designs define a pair of equivalent combinatorial functions to define a value of the pair of corresponding output elements, wherein the pair of equivalent combinatorial functions are each defined over a respective set of input elements;
    obtaining a path in the first circuit design, the path commencing in an input element and ending in an output element, wherein the input element and the output element are connected by combinational logic elements;
    automatically extracting, by a computer, a sensitization function of the path in the first circuit design; and
    automatically determining, by the computer, one or more paths in the second circuit design which are sensitized by the sensitization function of the path in the first circuit design.

11. The apparatus of claim 10, wherein the first and second circuit designs are combinationally equivalent representations of a same circuit, each having a different abstraction level.

12. The apparatus of claim 10, wherein the first circuit design is a post-synthesis version of a circuit and the second circuit design is a pre-synthesis version of the circuit.

13. The apparatus of claim 12, wherein the path in the first circuit design is associated with a timing problem, and the method further comprising a user modifying the one or more paths in the second circuit design to fix the timing problem.

14. The apparatus of claim 10, wherein the processor is further adapted to perform: using the one or more paths in the second circuit design for an activity selected from a group consisting of: back annotation and Engineering Change Order (ECO).

15. The apparatus of claim 10, wherein said automatically determining comprises determining all paths in the second circuit design that correspond to the path in the first circuit design.

16. The apparatus of claim 10, wherein there exists at least one signal in one of the paths selected from the path in the first circuit design and the one or more paths in the second circuit design that has no corresponding signal in its counterpart.

17. The apparatus of claim 10, wherein the input and output elements comprise primary inputs, primary outputs and memory elements.

18. A computer program product comprising a non-transitory computer readable medium retaining program instructions, which instructions when read by a processor, cause the processor to perform a method comprising:
    obtaining a first circuit design and a second circuit design, wherein the first and second circuit designs are separate circuit designs, wherein the first and second circuit designs have corresponding sets of input and output elements, wherein for each pair of corresponding output elements, the first and second circuit designs define a pair of equivalent combinatorial functions to define a value of the pair of corresponding output elements, wherein the pair of equivalent combinatorial functions are each defined over a respective set of input elements;
    obtaining a path in the first circuit design, the path commencing in an input element and ending in an output element, wherein the input element and the output element are connected by combinational logic elements;
automatically extracting, by a computer, a sensitization function of the path in the first circuit design; and automatically determining, by the computer, one or more paths in the second circuit design which are sensitized by the sensitization function of the path in the first circuit design.

* * * * *